United States Patent [19]

Scholten

[11] Patent Number: 5,015,623
[45] Date of Patent: May 14, 1991

[54] PLANAR JOSEPHSON DEVICE WITH A SILVER SALT INTERLAYER

[75] Inventor: Daphne Scholten, Eindhoven, Netherlands

[73] Assignee: U.S. Philips Corporation, New York, N.Y.

[21] Appl. No.: 549,341

[22] Filed: Jul. 6, 1990

[30] Foreign Application Priority Data

Jul. 20, 1989 [NL] Netherlands .................. 8901874

[51] Int. Cl.$^5$ ............................................. H01L 39/22
[52] U.S. Cl. ................................... 505/1; 437/910;
148/DIG. 89; 357/5; 505/702; 505/780; 427/62
[58] Field of Search ............... 437/910; 148/DIG. 89; 357/5; 505/1, 702; 427/62

[56] References Cited

U.S. PATENT DOCUMENTS

| | | | |
|---|---|---|---|
| 4,904,619 | 2/1990 | Yamada et al. | 437/190 |
| 4,954,480 | 9/1990 | Imanaka et al. | 505/1 |
| 4,965,248 | 10/1990 | Poppe et al. | 505/1 |

FOREIGN PATENT DOCUMENTS 89225236  1/1987  Japan.
90017872  5/1988  Japan.
1-300575  12/1989  Japan.

Primary Examiner—Olik Chaudhuri
Assistant Examiner—Ken S. Kim
Attorney, Agent, or Firm—Norman N. Spain

[57] ABSTRACT

The invention relates to a Josephson device and a method of manufacturing such a device which comprises two layers 11, 11' of an oxidic superconducting material between which at least one non-superconducting layer 13 of silver sulphate is provided. The non-superconducting layer 13 is connected to the superconducting layers 11, 11' through silver layers 12, 12'.

5 Claims, 1 Drawing Sheet

PLANAR JOSEPHSON DEVICE WITH A SILVER SALT INTERLAYER

BACKGROUND OF THE INVENTION

The invention relates to a planar Josephson device and a method of manufacturing thereof, which device comprises two layers of an oxidic superconducting material between which at least one non-superconducting layer is provided.

A method of manufacturing a Josephson device or Josephson junction is described in an article by M. G. Blamire et. al., in J. Phys. D: Appl. Phys. 20, pages 1330–1335 (1987). In this article, a sapphire substrate is provided with a buffer layer of $Y_2O_3$ to which a first oxidic superconducting layer of $YBa_2Cu_3O_{7-\delta}$ is applied. Subsequently, a thin layer of $Y_2O_3$ is provided which serves as a tunnel barrier. Next, a second layer of $YBa_2Cu_3O_{7-\delta}$ is applied, on which contacts of Nb may be provided. The thin layers are manufactured by means of dc magnetron sputtering using metallic target plates in an oxidizing atmosphere. Patterns are formed in the layers by means of plasma etching or ion etching.

In the oxidic superconducting materials known so far, the superconducting properties, in particular the highest temperature $T_C$ at which superconductivity occurs, are negatively influenced by the presence of a large number of metallic elements, silver and gold being two of the few exceptions. In particular a disturbance of the oxygen content seems to have undesirable effects. In the manufacture of devices such as a Josephson junction, in which a tunnel barrier is required, it must therefore be precluded that diffusion takes place from the tunnel barrier towards the superconducting material or that a reaction between the tunnel barrier and the superconducting material takes place. For this purpose buffer layers of a metal which passes oxygen such as silver can be used, however, this is not always sufficient at a high temperature.

SUMMARY OF THE INVENTION

An object of the invention is, inter alia, to provide a Josephson device and a simple method of manufacturing such a device, in which apart from silver no other metallic elements are used in the tunnel barrier.

A further object of the invention is to provide a tunnel barrier for a Josephson device, which is stable at the high temperature necessary during firing the superconducting material.

An additional object of the invention is to provide a Josephson device in which the two superconducting films are both formed from the same or two different oxidic superconducting materials.

According to the invention, this object is achieved by a device and a method as described in the opening paragraph, in which the non-superconducting layer is manufactured from a silver salt which is connected to the superconducting layers through layers of silver.

DETAILED DESCRIPTION OF THE INVENTION

Examples of silver salts that can be employed are silver chloride, silver bromide, silver chlorate and silver phosphate. In a preferred embodiment of the method according to the invention the silver salt is silver sulfate.

In a suitable embodiment of the method according to the invention, the silver sulfate is manufactured from silver by a reaction with a mixture of sulphur dioxide and sulphur trioxide.

In an alternative embodiment of the method according to the invention, the silver sulfate is manufactured from silver by a reaction with hydrogen sulphide followed by oxidation with oxygen. A particular advantage of this embodiment is the possibility of simultaneously carrying the oxidation with oxygen and a firing step of the oxidic superconducting material.

A method of manufacturing a Josephson device in which a non-superconducting layer is connected to two layers of an oxidic superconducting material through layers of noble metal is described in the non-prepublished Netherlands Patent Application NL 8900405.

Thin films of oxidic superconducting material can be obtained by means of various methods which are known per se. In general, a high-temperature treatment is necessary to obtain the desired composition, in particular, as regards the oxygen balance and the valence of the metal atoms, in particular copper atoms. According to M. Gurvitch et. al. in Appl. Phys. Lett. 51 (13), pages 1027–1029 (1987) thin films of the oxidic superconducting material $YBa_2Cu_3O_{7-\delta}$ are manufactured, for example, by means of dc magnetron sputter deposition using metal target plates in an oxidizing atmosphere, followed by firing at a high temperature, for example 800° C. to 900° C. Other commonly used methods are vacuum evaporation, laser ablation and chemical deposition from the vapor phase. In Appl. Phys. Lett. 52 (21), pages 1828–1830 (1988), C. E. Rice et. al. describe a method of manufacturing thin films of Ca-Sr-Bi-Cu oxides by applying $CaF_2$, $SrF_2$, Bi and Cu by means of vacuum evaporation, followed by oxidation steps at 725° C. and 850° C. The treatments at high temperature are necessary to obtain a material having a high critical temperature $T_C$, i.e., the temperature below which superconducting behaviour occurs.

The invention will be explained in greater detail by means of exemplary embodiments and with reference to the accompanying drawing.

EXEMPLARY EMBODIMENT 1

Figure 2A:
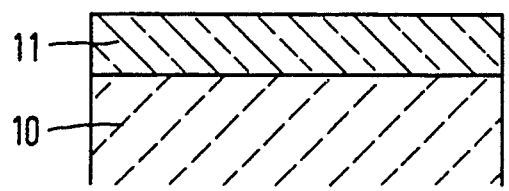
FIGS. 2a–2c show diagrammatically a number of steps of a method of the invention.

FIG. 2a shows a substrate 10 of strontium titanate $SrTiO_3$ on which an oxidic superconducting layer 11 of $YBa_2Cu_3O_{6.7}$ is provided, for example, by means of vacuum evaporation, the substrate being maintained at a temperature of 850° C. Other substrate materials, for example MgO, $Y_2O_3$ and substrates such as sapphire with protective buffer layers, for example $Ta_2O_5$, $LaF_3$ and $ZrO_2$ may also suitably be used in the method according to the invention.

Substitutions in the superconducting material may be carried out in known manner without affecting the effectiveness of the method according to the invention. For example, Y may be completely or partly replaced by rare earth metal ions, Ba may be replaced by Sr or Ca, and O may be partly replaced by F. The invention may be alternatively applied using other oxidic superconducting materials such as Ca-Sr-Bi-Cu oxides, Bi being partly replaceable by Pb, (La, Sr)$_2$CuO$_4$ and cuprates containing Ca and/or Ba in addition to Tl.

For the manufacture of the layer 11, sputtering using a target plate having the desired composition may for example be used instead of vacuum evaporation. In this process, the substrate is maintained at a high temperature but deposition may also take place at a lower temperature. In the latter case, an aftertreatment at a high temperature is required in order to obtain the desired superconducting properties.

Figure 2B:
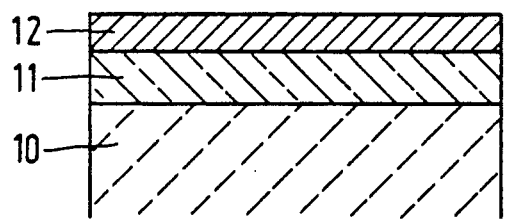

In a suitable embodiment of the method according to the invention, the layer 11 is manufactured by means of dc triode sputtering at a voltage of 1 kV in Ar at a pressure of approximately 0.5 Pa. Subsequently, this layer is subjected to a firing treatment at 700° C. to 800° C. in oxygen for approximately 2 hours, as a result of which the layer 11 obtains the appropriate oxygen content and the desired superconducting properties. A layer 12 of silver having a thickness of 50 nm, see FIG. 2b, is applied to the layer 11, for example, by means of sputtering. Subsequently, the layers are subjected to a firing treatment at 450° C. in oxygen for 0.5 hours, thus forming a superconducting contact between the silver 12 and the superconducting material 11.

Figure 2C:
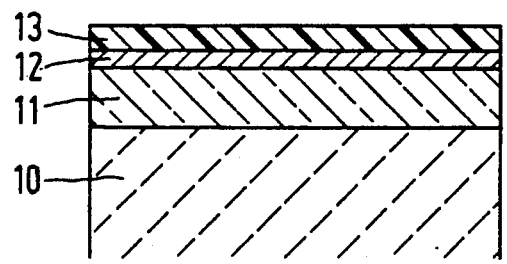

The surface of the silver layer is converted into silver sulphate Ag$_2$SO$_4$ by a reaction with a gas mixture of H$_2$S and N$_2$ (volume ratio 1:4) at room temperature and a pressure of 1 atmosphere for 10 minutes, followed by a post-firing treatment at 350° C. in oxygen for 1 hour. In this manner, a layer 13 of silver sulfate having a thickness of approximately 2 nm is manufactured the resultant structure being shown in FIG. 2c.

Figure 1:
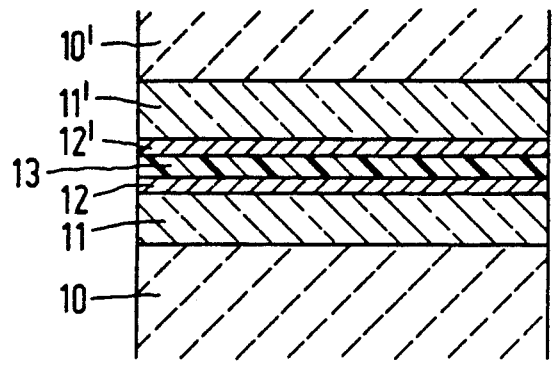
FIG. 1 is a cross-sectional view of a Josephson device of the invention.

A second superconducting layer 11' which is applied to a substrate 10' and on which a silver layer 12' is provided, is pressed onto the silver sulfate layer 13 at a temperature of 200° C. and a pressure of approximately 30 N/mm$^2$ in an oxygen atmosphere. FIG. 1 shows the Josephson device manufactured in this manner.

Prior to pressing the two parts of the Josephson device together, the layers may be provided, in known manner, with patterns, for example, by means of photolithographic techniques followed by plasma etching or ion etching.

The Josephson device may alternatively be manufactured in such a manner that after forming the silver sulfate layer 13 a silver layer 12' is provided thereon by means of vacuum evaporation after which a superconducting layer 11' is applied to the silver layer 12'.

It is particularly efficacious to ensure that the conversion of silver sulfide (formed by the reaction with H$_2$S) into silver sulfate takes place simultaneously with the firing treatment necessary for the superconducting layer or layers.

EXEMPLARY EMBODIMENT 2

A Josephson device is manufactured in the manner described in exemplary embodiment 1, with this difference that the silver sulfate layer 13 is manufactured by a reaction of the silver layer 12 with a gas mixture of SO$_2$ and SO$_3$ (volume ratio 1:1) at room temperature and atmospheric pressure for 10 minutes.

I claim:

1. A method of manufacturing a Josephson device comprising two layers of an oxidic superconducting material between which at least one non-superconducting layer is provided, characterized in that the at least one non-superconducting layer is manufactured from a silver salt selected from the group consisting of silver chloride, silver bromide, silver chlorate, silver phosphate and silver sulfate selected from the group consisting of silver chloride, silver bromide, silver chlorate, silver phosphate and silver sulfate which is connected to the superconducting layers through layers of silver.

2. A method as claimed in claim 1, characterized in that the silver salt is silver sulfate.

3. A method as claimed in claim 2, characterized in that the silver sulfate is manufactured from silver by a reaction with a mixture of sulphur dioxide and sulphur trioxide.

4. A method as claimed in claim 2, characterized in that the silver sulfate is manufactured from silver by a reaction with hydrogen sulfide followed by oxidation with oxygen.

5. A method as claimed in claim 4, characterized in that the oxidation with oxygen is carried out simultaneously with a firing of the oxidic superconducting material.

* * * * *